United States Patent
Ehmke et al.

(10) Patent No.: US 11,858,806 B2
(45) Date of Patent: Jan. 2, 2024

(54) VERTICAL SHEAR WELD WAFER BONDING

(71) Applicant: Texas Instruments Incorporated, Dallas, TX (US)

(72) Inventors: John Charles Ehmke, Garland, TX (US); Ivan Kmecko, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 10 days.

(21) Appl. No.: 17/399,832

(22) Filed: Aug. 11, 2021

(65) Prior Publication Data

US 2021/0371272 A1 Dec. 2, 2021

Related U.S. Application Data

(63) Continuation of application No. 17/008,133, filed on Aug. 31, 2020, now abandoned, which is a continuation of application No. 16/215,628, filed on Dec. 10, 2018, now Pat. No. 10,759,658.

(51) Int. Cl.
*B81B 7/00* (2006.01)
*B81C 1/00* (2006.01)

(52) U.S. Cl.
CPC ........ *B81B 7/0041* (2013.01); *B81C 1/00293* (2013.01); *B81C 2203/0118* (2013.01)

(58) Field of Classification Search
None
See application file for complete search history.

(56) References Cited

U.S. PATENT DOCUMENTS

| | | | |
|---|---|---|---|
| 10,759,658 B2 | 9/2020 | Ehmke et al. | |
| 2010/0134994 A1* | 6/2010 | Lee | H01L 25/072 361/783 |
| 2011/0314669 A1 | 12/2011 | Stamper et al. | |
| 2018/0374813 A1* | 12/2018 | Khazaka | H01L 24/11 |
| 2019/0051629 A1* | 2/2019 | Kim | H01L 24/13 |

FOREIGN PATENT DOCUMENTS

WO 2004025727 A1 3/2004

* cited by examiner

*Primary Examiner* — Hsien Ming Lee
(74) *Attorney, Agent, or Firm* — Michelle F. Murray; Frank D. Cimino

(57) ABSTRACT

In described examples, a first metal layer is configured along a periphery of a cavity to be formed between a first substrate and a second substrate. A second metal layer is adjacent the first metal layer. The second metal layer includes a cantilever. The cantilever is configured to deform by bonding the first substrate to the second substrate. The deformed cantilevered is configured to impede contaminants against contacting an element within the cavity.

18 Claims, 4 Drawing Sheets

VERTICAL SHEAR WELD WAFER BONDING

CROSS-REFERENCE TO RELATED APPLICATION

This application is a continuation of U.S. patent application Ser. No. 17/008,133 filed Aug. 31, 2020, which is a continuation of U.S. patent application Ser. No. 16/215,628 filed Dec. 10, 2018 (now U.S. Pat. No. 10,759,658, issued Sep. 1, 2020), which applications are hereby incorporated herein by reference in their entireties.

BACKGROUND

Microelectromechanical system (MEMS) devices such as actuators, switches, motors, sensors, variable capacitors, spatial light modulators (SLMs) and similar microelectronic devices can be manufactured on a substrate. To protect such devices, sidewalls are formed on the substrate during manufacturing to form a sealable cavity, such that structures and devices within the cavity can be relatively isolated from an outside environment. However, contaminants can gradually migrate into the cavity, and can react with or otherwise interfere with proper operation of devices included within the cavity.

SUMMARY

In described examples, a first metal layer is configured along a periphery of a cavity to be formed between a first substrate and a second substrate. A second metal layer is adjacent the first metal layer. The second metal layer includes a cantilever. The cantilever is configured to deform by bonding the first substrate to the second substrate. The deformed cantilevered is configured to impede contaminants against contacting an element within the cavity.

DETAILED DESCRIPTION OF EXAMPLE EMBODIMENTS

Figure 1:
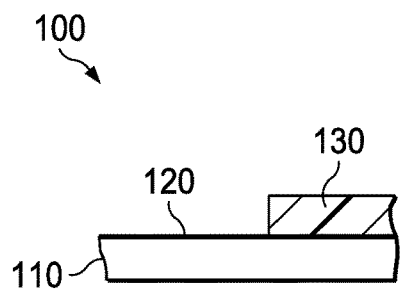
FIG. 1 is a cross-sectional diagram of an example first-substrate assembly for hermetic vertical shear weld wafer bonding.

In this description: (a) the term "portion" can mean an entire portion or a portion that is less than the entire portion; (b) the term "formed on a substrate" can mean being arranged such that the "formed" object is supported by the substrate and extends above a preexisting surface of the substrate; (c) the terms "inwards" and "inner" can refer to a direction towards a cavity formed on a substrate; (d) the terms "outwards" and "outer" can refer to a direction away from a cavity formed on a substrate, such as a direction towards a wafer edge, a die edge, or a saw lane; (e) the terms "downwards" and "lower" can refer to a direction towards a first substrate, such as a silicon substrate; and (f) the terms "upwards" and "upper" can refer to a second substrate, such as a glass wafer.

Microelectromechanical system (MEMS) devices such as actuators, switches, motors, sensors, variable capacitors, spatial light modulators (SLMs) and similar microelectronic devices can have movable elements. For example, an SLM device can include an array of movable elements. Each such element can be an individually addressable light modulator element in which an "on" or "off" position is set in response to input data. The input data can be image information to command light modulator elements of the array to either project or block light directed at the array from an illumination source.

In an example SLM device of an image projection system, the input data includes bit frames generated in response to pixel hue and intensity information data of an image frame of an image input signal. The bit frames can be projected using a pulse-width modulation. Pulse-width modulation schemes include weighted time intervals for projection of pixels of pixel hue and intensity corresponding to respective pixels in the input data. The weighted time intervals are sufficiently long to permit human eye integration over a given image frame display period. An example of an SLM device is a digital micromirror device (DMD), such as a Texas Instruments DLP® micromirror array device. Such DMD devices have been commercially employed in a wide variety of devices, such as televisions, cinemagraphic projection systems, business-related projectors and pico projectors.

DMD devices can be manufactured to include micromirrors to digitally image and project an input digital image onto a display surface (such as a projection screen). For example, a projector system can include a DMD device can be included arranged to modulate an incident beam of light received through a window glass of the DMD device and focused on micromirrors therein. Each such micromirror can be individually and dynamically adjusted in response to input data to project a visual image onto a projection screen.

An individual micromirror can be formed as a portion of a torsion spring. When the mirror goes "hard over," the mirror contacts (e.g., hits) a stopping surface. Occasionally, the contacting mirror encounters environmentally induced adhesion (e.g., stiction) forces sufficient to prevent the mirror from rebounding from the stopping surface. Such stiction can result from environmental contamination and can create defects and reliability problems.

Another such problem is excessive dynamic friction, which can result from contact between moving elements in a MEMS device. Both the excessive dynamic friction and the incidence of adhesion can be reduced by coating surfaces of the moving elements of a MEMS device with a passivating agent or lubricant (e.g., "lube").

However, the passivating agents and lubricating coatings can be compromised by other chemical species used to manufacture a MEMS device. Over time, chemical species can migrate and then degrade the performance of moving elements of a MEMS device. Such coatings for MEMS devices are described in U.S. patent application Ser. No. 14/333,829, filed Jul. 17, 2014, entitled "Coatings for Relatively Movable Surfaces," by W. Morrison, et al., which is incorporated herein by reference in its entirety for all purposes.

In the manufacture of semiconductors and MEMS devices, each MEMS device is manufactured using wafer-scale processing techniques. For example, a wafer can include many like MEMS devices arranged in rows and columns (e.g., in an array) on a substrate of a single wafer. Such techniques can decrease costs because many devices can be processed in parallel by simultaneously applying process steps. Various MEMS devices can be formed on a surface of a first substrate (such as a silicon substrate). Bondline structures can be formed (e.g., positioned) on the first substrate or a second substrate. The bondline structures can: define a distance that separates the first and second substrates; structurally bond the first substrate to the second substrate to form a unified substrate assembly; and hermetically seal a cavity enclosed by the first and second substrates and the bondline structures.

Various wafer-to-wafer bonding processes for forming a hermetically sealed cavity can include substances or conditions that can compromise delicate components formed within the hermetically sealed cavity and/or extending under a bondline structure of the wafer-to-wafer bond. For example, high temperatures for melting eutectic substances and/or fusing glass frit can melt or accelerate chemical processes that degrade performance of the delicate components. Similarly, the relatively high temperatures can more quickly degrade lubrication systems in the cavity by heat-accelerated reactions of eutectic metallurgical substances (including, for example, selenium, indium and/or other low-temperature materials) with lubrication substances. Further, the lubrication systems and anodic bonding used to form surface-fabricated MEMS structures can contaminate otherwise clean and flat surfaces used to form wafer-to-wafer bonds. Also, pressures encountered in forming the wafer-to-wafer bonds cause thermocompression, which tends to damage CMOS (complementary-metal-oxide semiconductor) circuitry (including gates and related metallization).

In described examples, a MEMS device and/or a CMOS device is sealed in such a cavity, such that the sealed device is environmentally protected from an outside environment. Electrical signals can be coupled to and from the sealed device via electrical conductors traversing a hermetically sealed sidewall, for example, without compromising the cavity seal.

As described hereinbelow, a bonding structure is formed on a substrate to impede (and/or otherwise restrict) reactant species against migrating into a cavity surrounded by the bonding structure. For example, the bondline structure can be arranged around (e.g., outwards from) the cavity, such that the migration of reactant species is impeded (e.g., prevented) from against entering a headspace of the cavity. The bonding substances can include inert (or relatively inert) metals (e.g., gold and nickel), such that reactive substances (such as indium, selenium and/or other reactant species) need not be intentionally included. Accordingly, outgassing from bonding substances in the sidewall of the bonding structure is minimized, such that contamination of sensitive structures such as micromirrors (as well as the coating of lubricant and/or passivating agents thereof) is reduced.

As described hereinbelow, reliability and performance of a sealed device can be improved by processes and structures for sealing devices in cavity formed during wafer-to-wafer bonding. The described processes and sidewall structures expose inert metals to the cavity, and are applied at low temperatures and low bonding pressures. The low temperatures and low bonding pressures used to form the sidewall structures helps protect metallization and/or circuitry formed beneath (or above) the sidewall.

Figure 4:
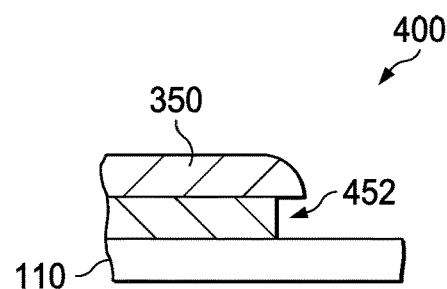
FIG. 4 is a cross-sectional diagram of an example first-substrate assembly including an exposed vertical edge of a fulcrum for hermetic vertical shear weld wafer bonding.

In an example, a plating process forms an gold overplated edge. The gold overplated edge can be an overhanging portion of a gold cantilevered structure that is cantilevered subsequent to the plating of the gold layer by partially etching away an underlying resist. The gold overplated edge includes a retrograde profile (e.g., as shown in FIG. 4, where a void exists underneath a suspended portion of the overplated gold). Such gold overplated edges are formed on first and second substrates, such that the first and second substrates can be bonded together (e.g., vertically bonded) by compressive forces. The compressive forces form a thermocompressive bond as a first gold overplated edge is compressed against a second gold overplated edge (e.g., which includes a retrograde profile that is inverted and mirrored with respect to the retrograde profile of the first gold overplated edge.

The thermocompressive bond can be formed at greatly reduced temperatures and pressure (e.g., as compare against processes involving fusing and/or melting of various eutectic substances). The thermocompressive bond can be formed at room temperature by applying normal (e.g., orthogonal) vertical compressive forces. The compressive forces induce localized vertical shearing of the first (e.g., lower) and second (e.g., upper) gold overplated edges, such that heat is locally generated by the vertical shearing. The vertical shearing welds the first and second gold overplated edges together to form a hermetic seal around a cavity for including a sealed device. The welding can occur at low pressures (e.g., atmospheric pressures) because the overplated structure deforms the gold edge in a localized area (e.g., which reduces net forces and pressure on the substrate and/or intervening structures that would be otherwise applied). In various examples described below (e.g., with respect to FIG. 7, FIG. 8 and FIG. 9), the strength of the wafer-to-wafer thermocompressive bonds can be increased by forming multiple concentric rings of shearing-induced sealing welds.

Figure 5:
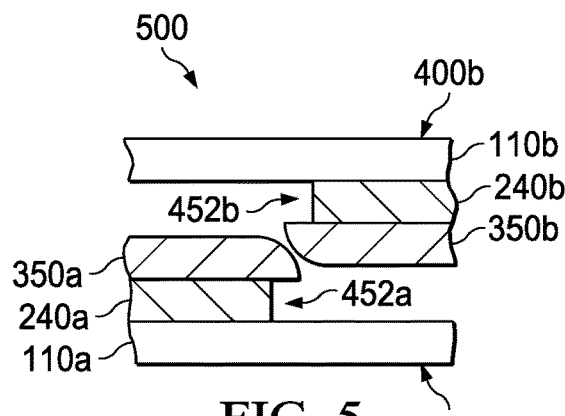
FIG. 5 is a cross-sectional diagram of example first- and second-substrate assemblies for hermetic vertical shear weld wafer bonding.

FIG. 1 is a cross-sectional diagram of an example first-substrate assembly for hermetic vertical shear weld wafer bonding. The assembly 100 includes a first substrate 110: the first substrate 110 can be a semiconductor wafer (or die) formed from a crystalline lattice of silicon or gallium arsenide, for example. As shown in FIG. 5, a second substrate 110b can be used to form structures similar to and suitable for bonding to the structures formed on the first substrate 110. The second substrate 110b can be of the same material as the first substrate 100a, or of a different material (e.g., glass, for transmitting light to the sealed device).

The first substrate 110 (and the second substrate 110b) can be formed in accordance with wafer-level processing to achieve an economy of scale in manufacture. (In other examples, die-level bonding processes and structures can replace the wafer-level bonding processes and structures described herein.) The first substrate 110 can be formed with terminals (e.g., pins, not shown) on a lower or upper surface of the first substrate 110 to electrically intercouple with other system devices arranged outside of a sealed cavity to be formed on the first substrate 110.

A seed layer 120 is deposited on the upper surface of the first substrate 110. The seed layer 120 can be deposited by a chemical vapor deposition process and includes a deposited material suitable for forming a layer of a first metal thereupon. In an example, the first metal layer can be relatively "hard" metal (such as nickel, which is "hard" relative to the hardness of gold).

A resist structure 130 is formed over the seed layer. The resist structure 130 delimits an edge for limiting a horizontal extent of the first metal to be deposited on the seed layer as described hereinbelow with reference to FIG. 2.

Figure 2:
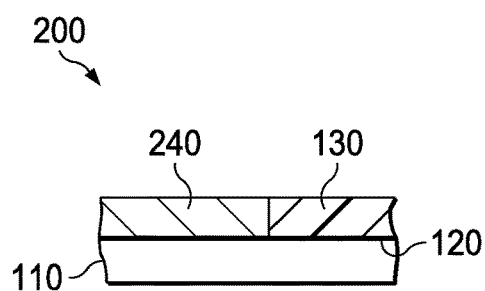
FIG. 2 is a cross-sectional diagram of an example first-substrate assembly including a first metal for hermetic vertical shear weld wafer bonding.

FIG. 2 is a cross-sectional diagram of an example first-substrate assembly including a first metal for hermetic vertical shear weld wafer bonding. Assembly 200 shows a first metal layer 240 (e.g., of nickel) deposited on the upper surface of the substrate 100. The resist 130 includes a vertical surface adjacent to the first metal layer 240, which determines the shape and location of the adjacent vertical surface of the first metal layer 240. The intersection of the first metal layer 240 upper surface and the first metal layer 240 adjacent vertical surface is a fulcrum against which a hermetic vertical shear weld wafer bond can be formed (e.g., as described hereinbelow with respect to FIG. 6).

The first metal layer 240 can be deposited to a depth determined in part by the height of the resist 130, such that a flat surface is formed by the upper surfaces of the resist 130 and the first metal layer 240. The upper surfaces of the resist 130 and the hard metal layer 240 can optionally be planarized to form the flat surface. The flat surface can be used to deposit a layer of a second metal thereupon as described hereinbelow with reference to FIG. 3.

Figure 3:
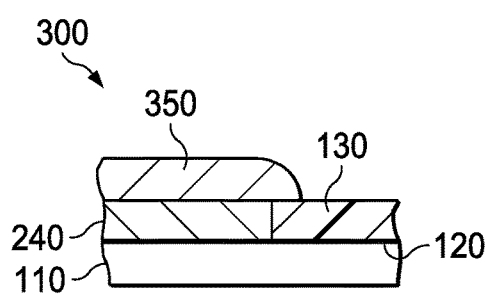
FIG. 3 is a cross-sectional diagram of an example first-substrate assembly including a second metal for hermetic vertical shear weld wafer bonding.

FIG. 3 is a cross-sectional diagram of an example first-substrate assembly including a second metal for hermetic vertical shear weld wafer bonding. Assembly 300 includes a second metal layer 350 deposited over the upper surfaces of the resist 130 and the first metal layer 240.

In an example, the second metal layer 350 is a "soft" metal (e.g., gold) relative to the hardness of the metal (e.g., nickel) of the first metal layer 240. For example, the first metal layer 240 retains its shape (e.g., because of the relative hardness to the second metal layer 350), including the shape (e.g., edge) of the fulcrum around which the second metal is deformed (e.g., bent and sheared). The second metal layer 350 is deformed around the fulcrum by compressive forces applied for forming a hermetic vertical shear weld wafer bond (e.g., as described hereinbelow with respect to FIG. 6).

The second metal layer 350 can be patterned to cover the first metal layer 240, the resist 130 and the vertical interface between (e.g., adjacent to both) the first metal layer 240 and the resist 130. The second metal layer 350 includes a chamfered edge (e.g., a radiused edge, as shown in profile in FIG. 3), which is formed (e.g., formed at least in part) over the resist 130. The chamfered edge includes a sloped profile for "self-centering" a second-substrate assembly during a wafer-to-wafer bonding of the first- and second-substrates as described hereinbelow with respect to FIG. 5. The radius of the chamfered edge provides a net horizontal component of force when the second-substrate assembly is misaligned (e.g., slightly misaligned), such that the net horizontal component of force tends to correct (e.g., tends to self-center) for the horizontal misalignment of the first- and second-substrate assemblies by urging the first- and second-substrate assemblies into horizontal alignment.

As described herein below with reference to FIG. 4, the resist 130 (e.g., which is below and subjacent to the chamfered edge of the second metal layer 350) is evacuated to expose a vertical edge of the fulcrum of the first metal layer 240.

FIG. 4 is a cross-sectional diagram of an example first-substrate assembly including an exposed vertical edge of a fulcrum for hermetic vertical shear weld wafer bonding. Assembly 400 includes an exposed vertical edge 452 of a fulcrum. The exposed vertical edge of a fulcrum is exposed by evacuating (e.g., etching away) the resist 130.

Accordingly, the chamfered edge of the second metal layer 350 overhangs (e.g., is cantilevered) over the substrate 110, such that a void exists beneath the cantilevered portion of the second metal layer 350. The void beneath the cantilevered portion of the second metal layer 350 includes a space into which the second metal layer 350 can be bent and deformed as described hereinbelow.

FIG. 5 is a cross-sectional diagram of example first- and second-substrate assemblies for hermetic vertical shear weld wafer bonding. Assembly 500 includes assemblies 400a and 400b. Assembly 400a is an assembly such as assembly 400, whereas assembly 400b is an assembly similar to the assembly 400. The assembly 400b includes sidewall structures (such as a first metal layer 240b and a second metal layer 350b) that are positioned (or otherwise offset) on the second substrate to be aligned with respective edges of the first assembly 400a. The alignment intersperses prominences of the assemblies 400a and 400b for vertical mating, For example, the respective chamfered edges (of the second metal layers 350a and 350b) are mutually sheared when vertically compressed together (as described hereinbelow with respect to FIG. 6 and FIG. 7).

The assembly 400a includes a substrate 110a, first metal layer 240a, second metal layer 350a and vertical edge 452a of a lower fulcrum (which respectively correspond to the substrate 110, first metal layer 240, and second metal layer 350 and vertical edge 452 of the first substrate 110). Similarly, the assembly 400b includes a substrate 110b, first metal layer 240b, second metal layer 350b and vertical edge 452a of an upper fulcrum (which respectively correspond to the substrate 110, first metal layer 240, and second metal layer 350 and vertical edge 452 of the first substrate 110). The structures of the assembly 400b are inverted and mirrored with respect to the corresponding structures of the assembly 400a.

As described hereinbelow with respect to FIG. 6, the vertical edge 452a of the upper fulcrum and the vertical edge 452b of the lower fulcrum are vertically aligned and offset, such that the chamfered edges of the second metal structures 350a and 350b are deformed around the edges of the respective fulcrums of the first metal structures 240a and 240b in response to forces generated while vertically compressing the first assembly 400a and the second assembly 400b together.

Figure 6:
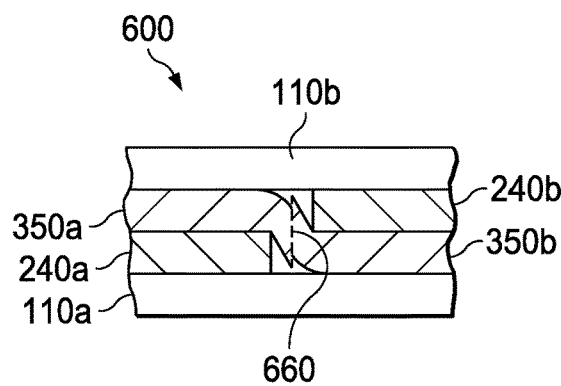
FIG. 6 is a cross-sectional diagram of example joined first- and second-substrate assemblies for hermetic vertical shear weld wafer bonding.

FIG. 6 is a cross-sectional diagram of example joined first- and second-substrate assemblies for hermetic vertical shear weld wafer bonding. Assembly 600 includes the assemblies 400a and 400b (described hereinabove with respect to FIG. 4 and FIG. 5), wherein the assemblies 400a and 400b are bonded (e.g., fused) together and hermetically sealed by the weld 660.

The weld 660 is formed in response to forces generated while compressing the first assembly 400a and the second assembly 400b together. For example, the assembly 400a can be formed on a first wafer (such as described hereinbelow with respect of FIG. 9) and the assembly 400b can be formed on a second wafer (such as described hereinbelow with respect of FIG. 9), which are compressed together during wafer-level processing (e.g., before singulation for producing individual dies).

As the first assembly 400a and the second assembly 400b are compressed together, the chamfered edges of the second metal layers 350a and 350b come into contact. The second metal layers 350a and 350b can include an inert, ductile metal such as gold. The area of contact between contacting portions of the second metal layers 350a and 350b is relatively small, which increases the localized pressures to values substantially higher than pressures mutually exerted between each of the first metal layers 240a and 240b and their respective substrates 110a and 110b (as well as any intervening components or structures between any adjacent layers and substrates). Accordingly, relatively high forces are applied to the chamfered edges of the second metal layers 350a and 350b, which are sufficiently high to deform (and optionally melt portions of) the chamfered edges without damaging the first metal layers, the respective substrates and/or any intervening components.

As the chamfered edges of the second metal layers 350a and 350b come into contact, torque is applied to each cantilevered portion of the second metal layers 350a and 350b. The torque is applied with respect to (e.g., around) a fulcrum formed by the arrangement (e.g., intersection) of the exposed vertical and adjacent (e.g., contacting a respective second metal layer 350a or 350b) horizontal faces of a respective first metal layers 240a or 240b. Accordingly, each fulcrum (which is formed by a first metal layer 240a or 240b) contacts a respective cantilevered portion of a second metal layer 350a or 350b.

As the first assembly 400a and the second assembly 400b continue to be further compressed together, each cantilevered portion of the second metal layers 350a and 350b is deformed: the cantilevered portion of the second metal layer 350a is bent in a generally downwards direction, whereas the cantilevered portion of the second metal layer 350b is bent in a generally upwards direction. The bending (e.g., which includes compressive, tensile and shear forces) of each such cantilevered portion—and friction (e.g., the friction opposing the slippage across the contacting surfaces of the second metal layers 350a and 350b)—generates localized heat sufficient to melt the interface between second metal layers 350a and 350b, such that a weld 660 (e.g., a hermetic vertical shear weld wafer bond) can be formed by fusing contacting portions of the second metal layers 350a and 350b.

After such welding, the hermetic vertical shear weld wafer bond formed by the weld 660 generates forces for bonding (e.g., fixedly bonding) the first assembly 400a and the second assembly 400b together as well as impedes the migration of contaminants such as reactant species across the weld 660 into a cavity, described hereinbelow with respect to FIG. 7.

Figure 7:
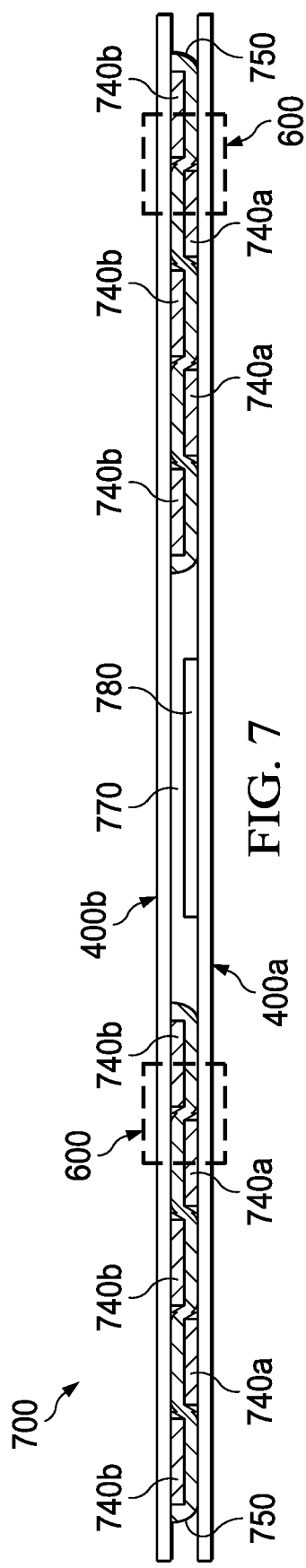
FIG. 7 is a cross-sectional elevational view of an example two-substrate assembly that includes example hermetic vertical shear weld wafer bonds.
Figure 8:
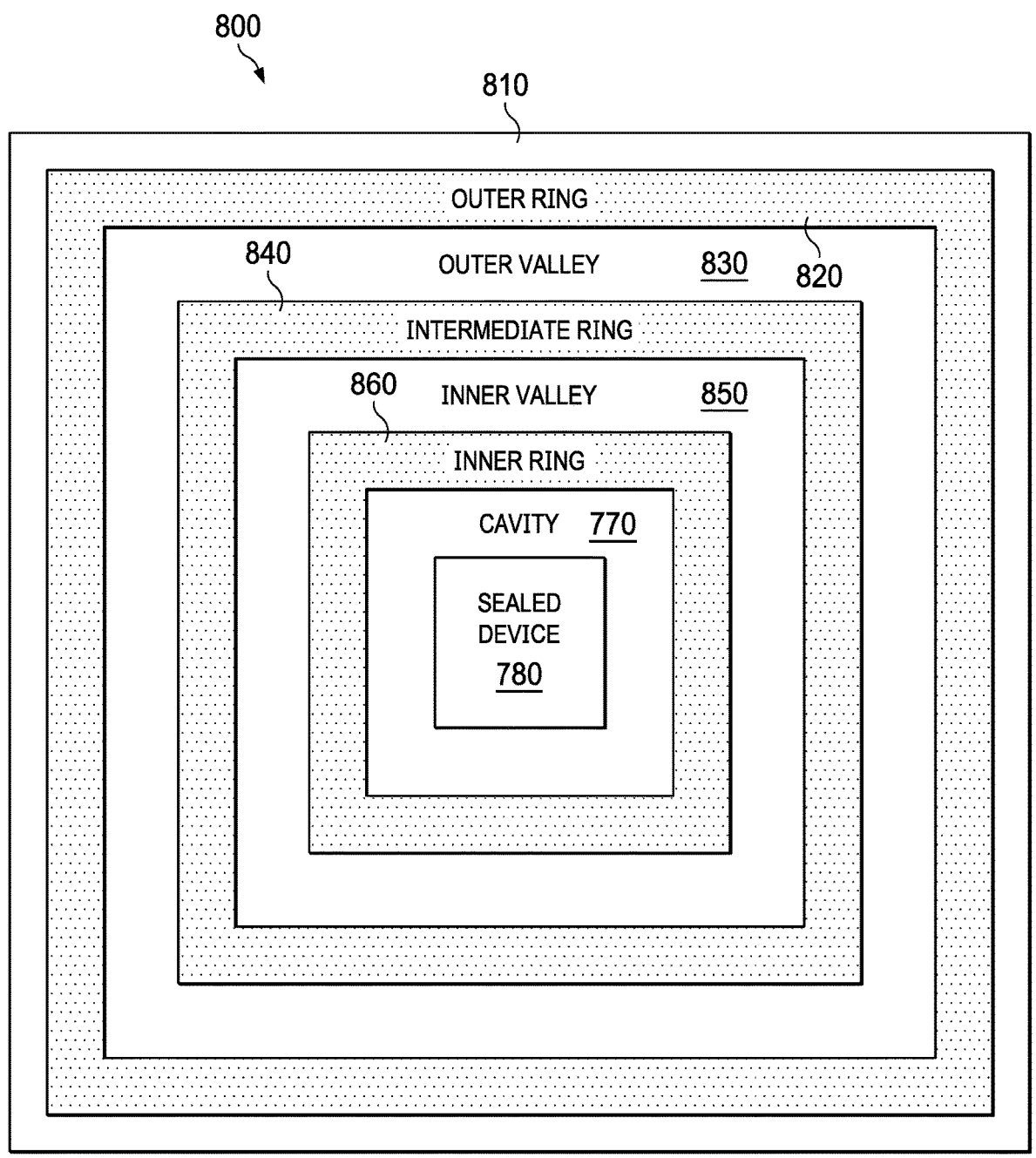
FIG. 8 is a top-view diagram of an example first-substrate assembly for hermetic vertical shear weld wafer bonding.
Figure 9:
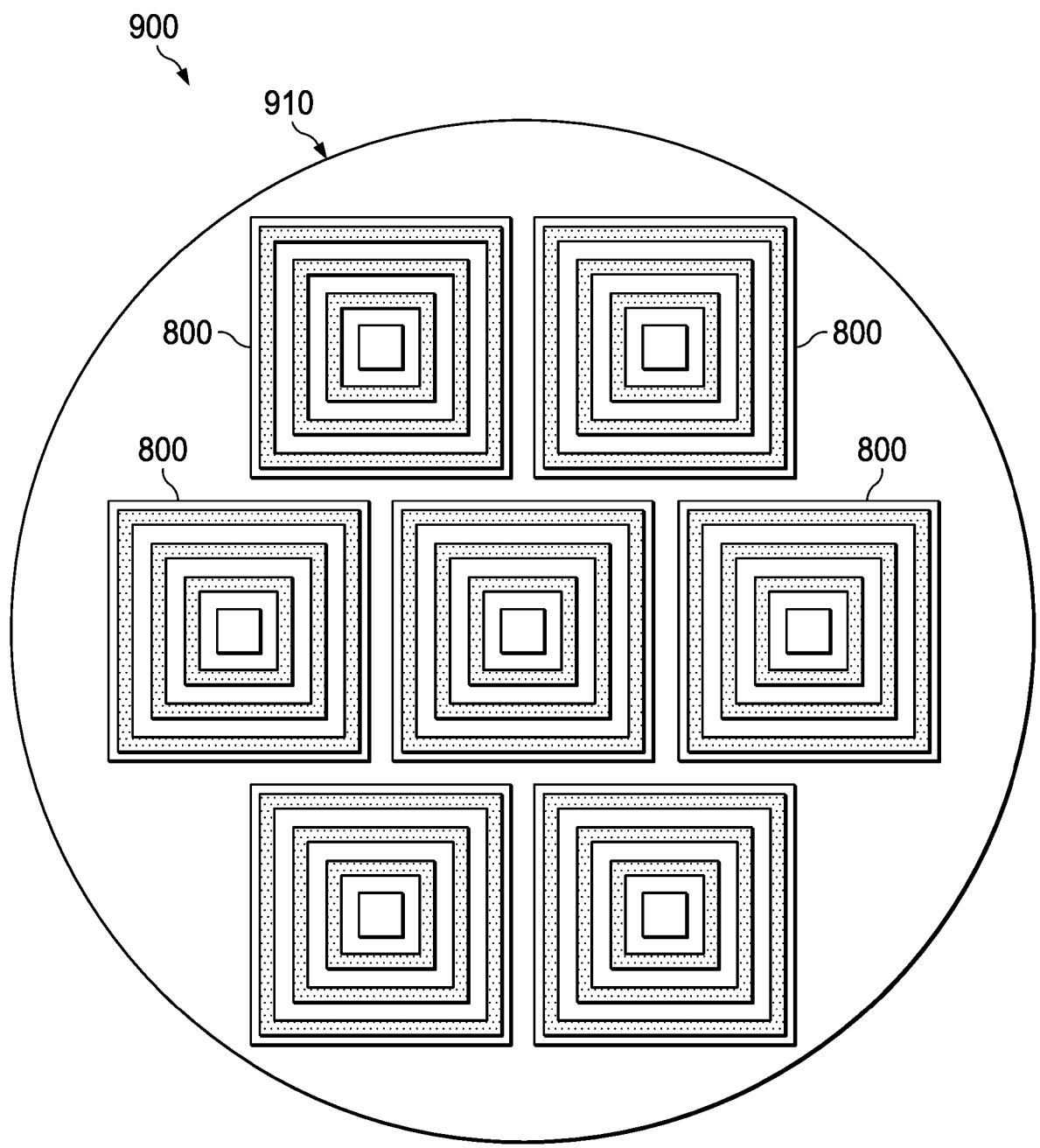
FIG. 9 is a top-view diagram of an example first-substrate wafer for hermetic vertical shear weld wafer bonding.

FIG. 7 is a cross-sectional elevational view of an example two-substrate assembly that includes example hermetic vertical shear weld wafer bonds. For example, the two-substrate assembly 700 (shown in cross-section) includes a first (e.g., lower) substrate 400a and a second (e.g., upper) substrate 400b. The first substrate 400a includes multiple instances of the first metal layers 740a (shown in cross-section), which are arranged (e.g., as rings 820, 840 and 860, as shown in FIG. 8 and FIG. 9) around a perimeter of the cavity 770 (e.g., which is to be hermetically sealed). The second substrate assembly 400b includes multiple instances of the first metal layers 740b (shown in cross-section), which are arranged around a perimeter of the cavity 770 and are positioned (e.g., interdigitated) between instances of the first metal layers 740a, such that multiple instances of a shear weld is formed (e.g., by compressing the substrate assemblies 400a and 400b together).

A shear weld is formed in the void between each first (e.g., lower) substrate 400a first (e.g., hard) metal layer 740a and a second (e.g., upper) substrate 400b first (e.g., hard) metal layer 740a. For example, assemblies 600 as shown in FIG. 7 include a shear weld as described hereinabove with respect to FIG. 6. The shear welds join adjacent segments of the second (e.g., soft) metal layers 740a and 740b (e.g., formed as separate segments on each of the first substrate 400a and the second substrate 400b) into a unified (e.g., continuous) seal 750.

The seal 750 extends outwards from the cavity 770 (e.g., to a saw lane, not shown) and extends around the perimeter the cavity (e.g., as shown in top view in FIG. 8 and FIG. 9), such that the cavity 770 is a hermetically sealed environment in which the sealed device 780 is protected from reactant species. The multiple instances of the shear weld, which ring the cavity 770 on all four sides, helps to increase the impermeability of the seal formed by the seal 750. Further, the seal 750 is an inert material, such that the sealed device 780 is not exposed to reactive species from bonding agents otherwise present in a sidewall structure.

Accordingly, the first and second metal layers form sidewalls for bonding the first substrate 400a and the second substrate 400b and for sealing the cavity 770. The sidewalls are positioned to protect sensitive components 180 of a chip (e.g., singulated die) within cavity peripherally supported by the sidewalls. The included device 780 can include an array of micromirrors (not shown) coupled to the first substrate 400a, where the performance of each micromirror could otherwise be degraded by the presence of reactive species or moisture from bonding agents or operational environments. Accordingly, the first substrate 400a, the second substrate 400b and the seal 700 help prevent the intrusion of contaminants such as reactant species, gasses and/or moisture into the cavity 770.

FIG. 8 is a top-view diagram of an example first-substrate assembly for hermetic vertical shear weld wafer bonding. The assembly 800 includes a first substrate 810 that includes an outer ring 820, and intermediate ring 840 and an inner ring 860 arranged for bonding to similar structures on a second substrate (not shown).

For example, the outer ring 820, and intermediate ring 840 and an inner ring 860 are metal layers, such as the first (e.g., hard) metal layers (e.g., 740a and 340a described hereinabove). As described hereinabove (e.g., with reference to FIG. 7), each of the rings extend upwards from the substrate 810, such that an outer valley 830 is formed between the outer ring 820 and the intermediate ring 840, and such that an inner valley 850 is formed between the intermediate ring 840 and the inner ring 860.

The rings of the second substrate (not shown) are arranged to mate with the rings 820, 840 and 860, such that the shear welds (e.g., shear welds 660) are formed in the voids adjacent (e.g., closely adjacent) to the outer ring 820, the intermediate ring 840 and the inner ring 860. Accordingly, each of the outer valley 830 and the inner valley 850 are arranged for including two shear welds and a second (e.g., soft) metal layer initially formed over corresponding first (e.g., hard) metal layers of the second substrate. (FIG. 7 shows an example configuration of hermetic vertical shear weld wafer bonding of a first substrate and the second substrate in cross-section.)

In response to the formation of the vertical shear welds, the cavity 770 is hermetically sealed, which protects the sealed device 780 against migration of reactant species, environmental gasses and moisture. The multiple rings enhance the degree of impermeability of the seal and increase the strength of the bonding forces between the upper and lower substrates.

FIG. 9 is a top-view diagram of an example first-substrate wafer for hermetic vertical shear weld wafer bonding. The wafer 900 includes a substrate 910 (which is a substrate such as the substrate 810, described hereinabove). Multiple instances of the assembly 800 are formed on the substrate 910. A corresponding wafer (e.g., arranged-to-fit wafer, not shown) includes similar structures positioned to mate within the valleys formed by the rings of each of the instances of the assembly 800. Accordingly, the wafer 900 (and the structures formed thereon) is arranged to mate with a corresponding wafer (not shown) in response to compressive forces applied to join and bond the wafer 900 and the corresponding wafer together.

Figure 10:
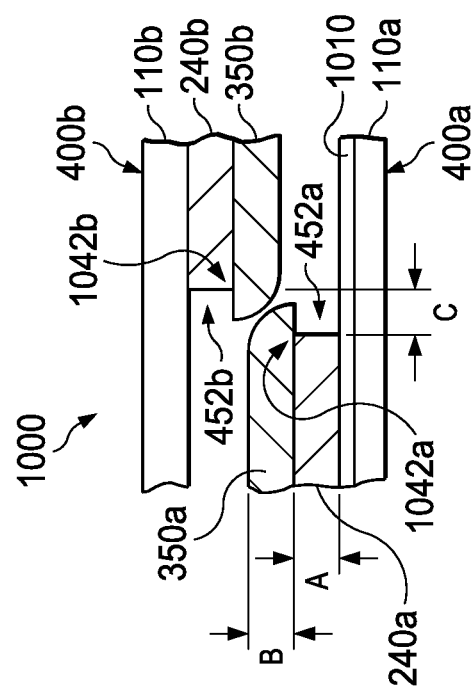
FIG. 10 is a cross-sectional diagram of dimensioning of components of example first- and second-substrate assemblies for hermetic vertical shear weld wafer bonding.

FIG. 10 is a cross-sectional diagram of dimensioning of components of example first- and second-substrate assemblies for hermetic vertical shear weld wafer bonding. For example, relative sizing and spacing of components in diagram 1000 can be described by the variables A, B and C: A is the depth of the first (e.g., nickel) metal layer 240*a* (and 240*b*); B is the depth of the second (e.g., gold) metal layer 350*a* (and 350*b*); and C is the width between the vertical projections of the exposed vertical edge 452*a* (of fulcrum 1042*a*) and the exposed vertical edge 452*b* (of fulcrum 1042*b*).

An example minimum spacing C for forming a complete vertical shear weld is:

$$C_{min} \geq \frac{\pi B^2}{2(A+B)} \quad \text{(Eq. 1)}$$

An example maximum spacing C for forming a complete vertical shear weld is:

$$C_{max} \leq 2B \quad \text{(Eq. 2)}$$

An example optimum spacing C for forming a complete vertical shear weld is:

$$C_{optimum} = \sqrt{2B} \quad \text{(Eq. 3)}$$

In an example where A is 5 microns, and B is 5 microns: $C_{max} \leq 10$ microns; $C_{min} \geq 3.9$ microns; and $C_{optimum} = 7.1$ microns.

Accordingly, hermetic vertical shear weld wafer bonding can be formed in accordance with wafer-level processing to achieve an economy of scale. The first metal layer 240*a* can be formed over a conductor and/or CMOS circuitry 1010, such that net forces for forming the hermetic vertical shear weld wafer bonding are not directly applied (and instead are distributed over greater areas), and such that the pressure applied to the underlying conductor and/or CMOS circuitry 1010 is substantially reduced (e.g., reduced sufficiently such that sufficient bonding pressure for generating vertical shear welds can be applied without damaging the underlying conductor and/or CMOS circuitry 1010).

Figure 11:
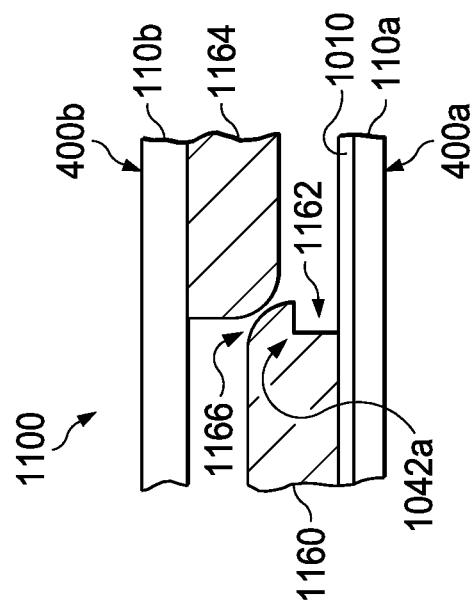
FIG. 11 is another cross-sectional diagram of example first- and second-substrate assemblies for hermetic vertical shear weld wafer bonding.

FIG. 11 is another cross-sectional diagram of example first- and second-substrate assemblies for hermetic vertical shear weld wafer bonding. The diagram 1100 includes a lower element 1160 having an exposed vertical edge 1162 and a cantilever 1166. The diagram 1100 includes an upper element 1164.

A method of forming an apparatus has been introduced. The method includes depositing a resist on a first substrate peripherally around a cavity including a first surface defiled by the first substrate. A first metal layer is deposited over the first substrate, wherein the first metal layer is deposited against a first vertical edge of the resist. A second metal layer is deposited over the first metal layer and the resist. The resist is removed to form a second metal layer cantilever and a void that extends between the second metal layer cantilever and the first substrate. A second substrate is bonded to the first substrate in response to a contacting structure of the second substrate deforming the second metal layer cantilever, wherein the contacting structure of the second substrate is forced against the second metal layer cantilever in response to compressing the first and second substrates together.

Modifications are possible in the described examples, and other examples are possible, within the scope of the claims.

What is claimed is:

1. An apparatus comprising:
    a first substrate;
    at least one first metal layer on the first substrate;
    a second substrate; and
    at least one second metal layer on the second substrate, a weld between the at least one first metal layer and the at least one second metal layer, the at least one second metal layer laterally offset with respect to the at least one first metal layer.

2. The apparatus of claim 1, wherein the at least one first metal layer comprises:
    a third metal layer on the first substrate; and
    a fourth metal layer between the third metal layer and the second substrate, and wherein the at least one second metal layer comprises:
    a fifth metal layer on the second substrate; and
    a sixth metal layer between the fifth metal layer and the first substrate, the weld between the fourth metal layer and the sixth metal layer.

3. The apparatus of claim 2, wherein the fourth metal layer is softer than the third metal layer.

4. The apparatus of claim 3, wherein the fourth metal layer comprises gold and the third metal layer comprises nickel.

5. The apparatus of claim 1, wherein the weld is a thermocompressive bond.

6. The apparatus of claim 1, wherein the first substrate comprises silicon and the second substrate comprises glass.

7. The apparatus of claim 6, wherein the first substrate comprises complementary metal oxide semiconductor (CMOS) circuitry under the at least one first metal layer.

8. An apparatus comprising:
    a substrate;
    a first metal layer on the substrate;
    a second metal layer on the first metal layer; and
    a third metal layer on the substrate, a weld between the third metal layer and the second metal layer, the third metal layer spatially offset with respect to the second metal layer.

9. The apparatus of claim 8, wherein the substrate is a first substrate, the apparatus further comprising:
a second substrate on the second metal layer; and
a fourth metal layer between the third metal layer and the second substrate.

10. The apparatus of claim 8, wherein the second metal layer is softer than the first metal layer.

11. The apparatus of claim 10, wherein the second metal layer comprises gold and the first metal layer comprises nickel.

12. The apparatus of claim 8, wherein the weld is a thermocompressive bond.

13. An apparatus comprising:
a first substrate;
a second substrate;
a first metal layer on the first substrate;
a second metal layer between the first metal layer and the second substrate;
a third metal layer on the second substrate; and
a fourth metal layer between the third metal layer and the first substrate, a weld between the second metal layer and the fourth metal layer, wherein the weld forms a seal around a cavity between the first substrate and the second substrate.

14. The apparatus of claim 13, wherein the first metal layer and the second metal layer are on a first side of the weld, and the third metal layer and the fourth metal layer are on a second side of the weld.

15. The apparatus of claim 13, wherein the weld is a thermocompressive bond.

16. The apparatus of claim 13, wherein the first substrate is a semiconductor substrate and the second substrate comprises glass.

17. The apparatus of claim 13, wherein the first metal layer comprises nickel, the third metal layer comprises nickel, the second metal layer comprises gold, and the fourth metal layer comprises gold.

18. The apparatus of claim 13, wherein the second metal layer is softer than the first metal layer.

* * * * *